(12) United States Patent
Han

(10) Patent No.: US 7,617,924 B2
(45) Date of Patent: Nov. 17, 2009

(54) TRAY TRANSPORTATION DEVICE

(75) Inventor: Hsin Hui Han, Hsin-Chu (TW)

(73) Assignee: King Yuan Electronics Co. Ltd., Hsin-Chu (TW)

( * ) Notice: Subject to any disclaimer, the term of this patent is extended or adjusted under 35 U.S.C. 154(b) by 129 days.

(21) Appl. No.: 11/852,095

(22) Filed: Sep. 7, 2007

(65) Prior Publication Data

US 2008/0308514 A1 Dec. 18, 2008

(30) Foreign Application Priority Data

Jun. 15, 2007 (TW) .............................. 96121925 A

(51) Int. Cl.
*B65G 25/00* (2006.01)
(52) U.S. Cl. ........................ 198/741; 198/747; 414/940
(58) Field of Classification Search ................. 198/741, 198/747, 736, 737, 738; 414/940
See application file for complete search history.

(56) References Cited

U.S. PATENT DOCUMENTS

| | | | | |
|---|---|---|---|---|
| 4,018,328 A | * | 4/1977 | Galarowic et al. .......... | 198/741 |
| 5,320,212 A | * | 6/1994 | McIntosh et al. ............ | 198/738 |
| 5,363,785 A | * | 11/1994 | Conley, Jr. ............. | 112/470.06 |
| 6,235,634 B1 | * | 5/2001 | White et al. ................ | 438/680 |
| 6,248,967 B1 | * | 6/2001 | Nakamura .................. | 209/573 |
| 6,422,798 B1 | * | 7/2002 | Lauinger et al. ............ | 414/217 |

* cited by examiner

*Primary Examiner*—Mark A Deuble
(74) *Attorney, Agent, or Firm*—Muncy, Geissler, Olds & Lowe, PLLC

(57) ABSTRACT

A tray transportation device is disclosed in this invention. The tray transportation device includes a transfer stage, a loading handler, an operation handler and an unload stage. The transfer stage has a buffer area and an operation area. The loading handler is disposed on the buffer area to handle a tray in the buffer area. The operation handler is disposed on the operation area to handle a tray in the operation area. The unload stage is used to carry the tray transferred from the transfer stage. The loading handler and the operation handler move together, when the operation handler transfers the tray from the operation area to the unload stage; the loading handler transfers the tray from the buffer area to the operation area.

20 Claims, 8 Drawing Sheets

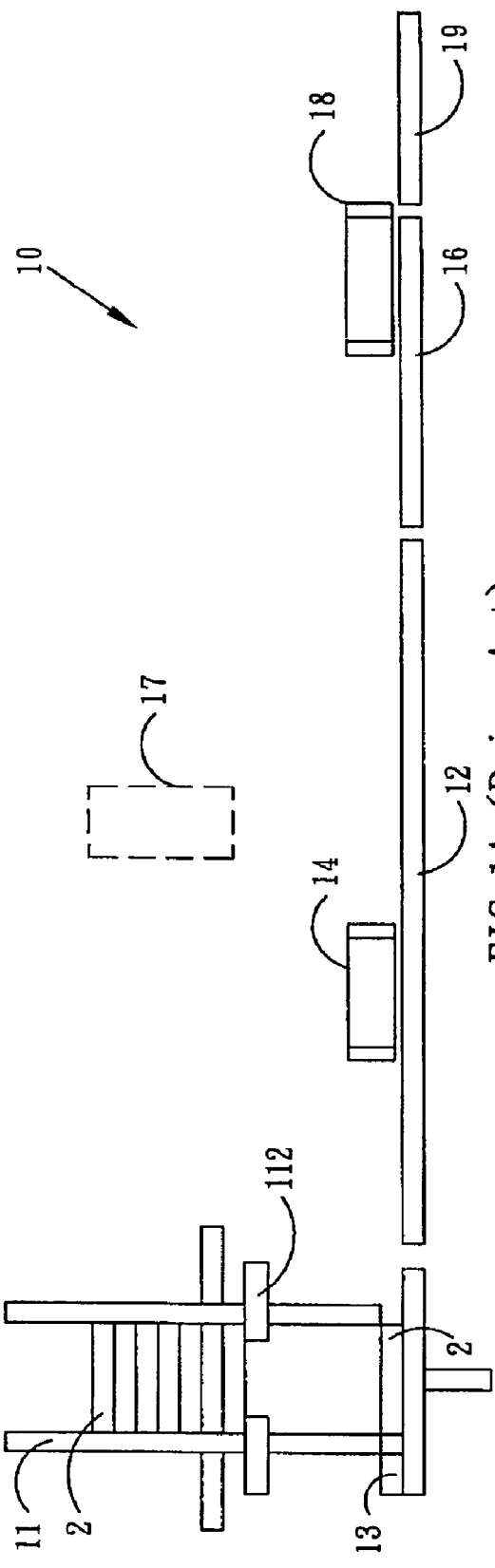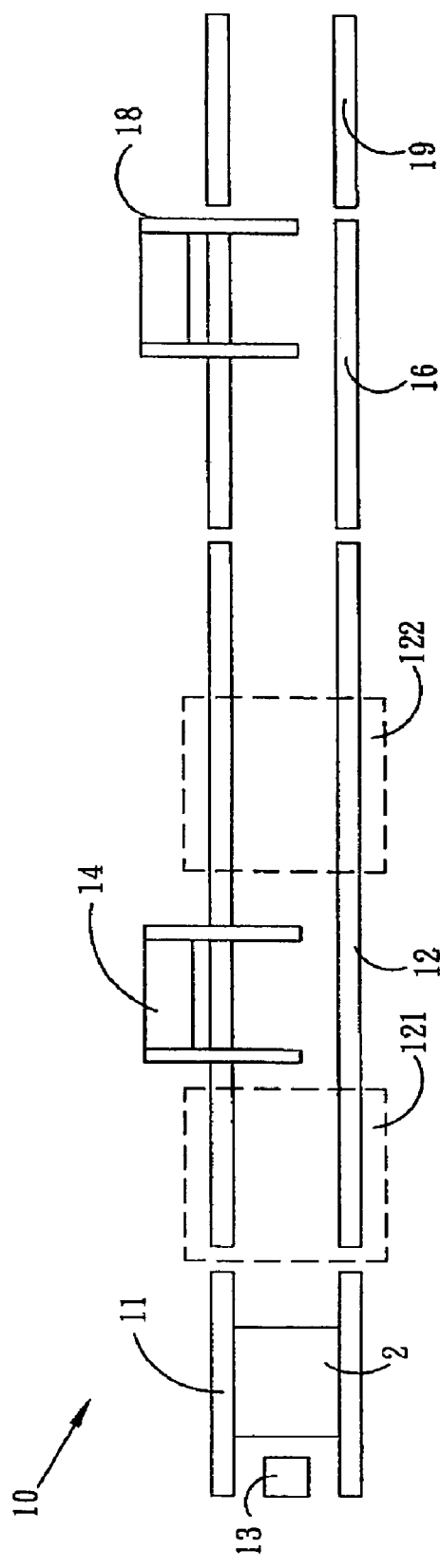
FIG. 1A (Prior Art)
FIG. 1B (Prior Art)

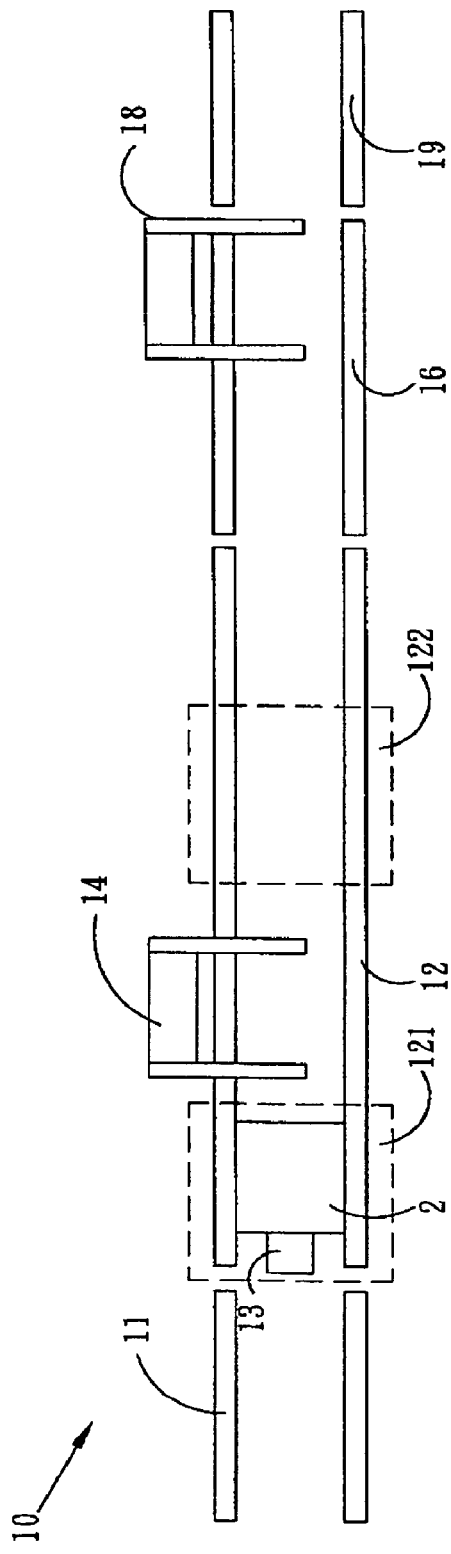
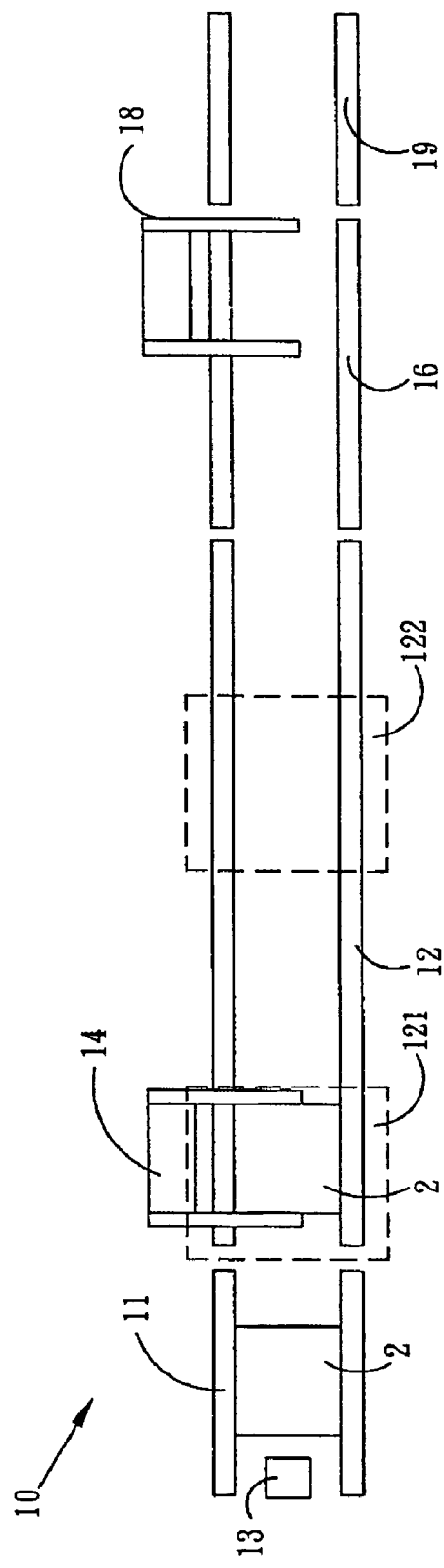
FIG. 1C (Prior Art)
FIG. 1D (Prior Art)

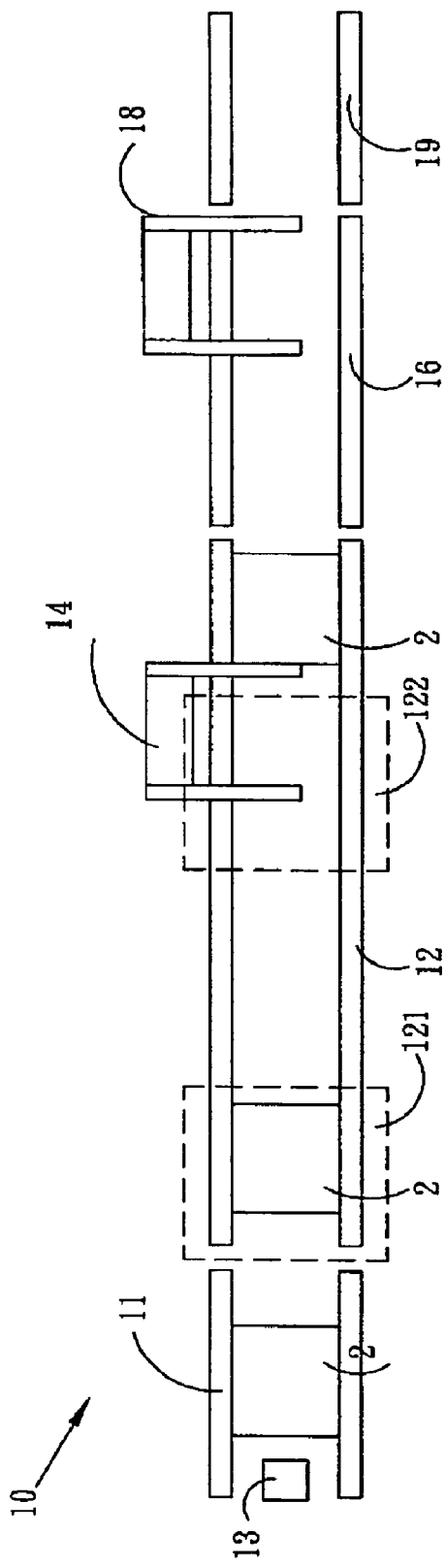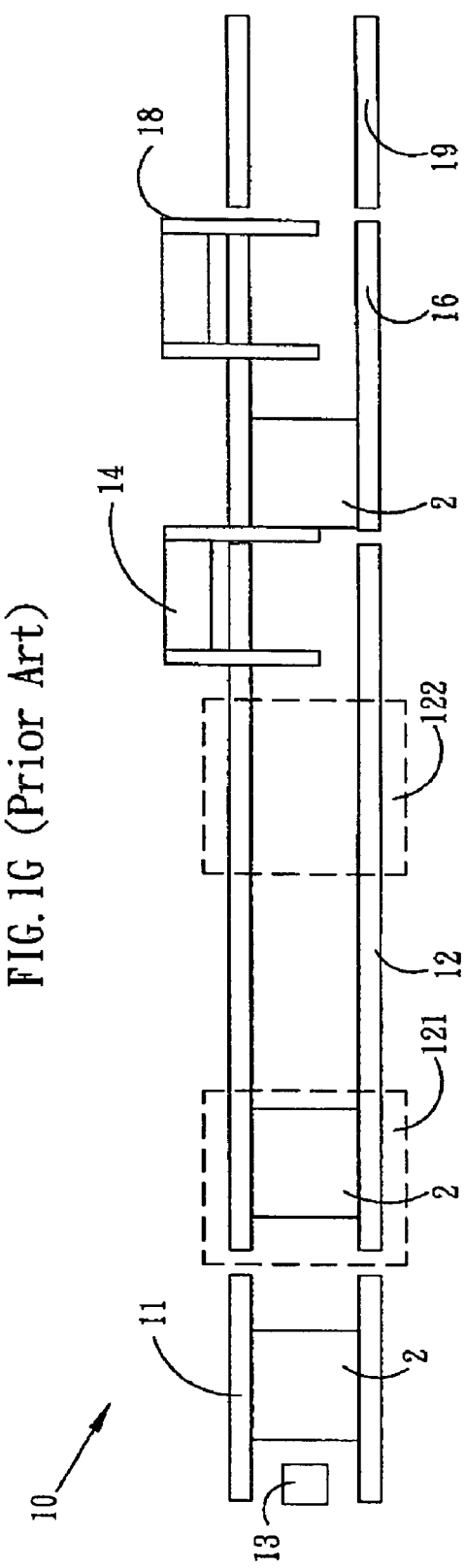
FIG. 1G (Prior Art)
FIG. 1H (Prior Art)

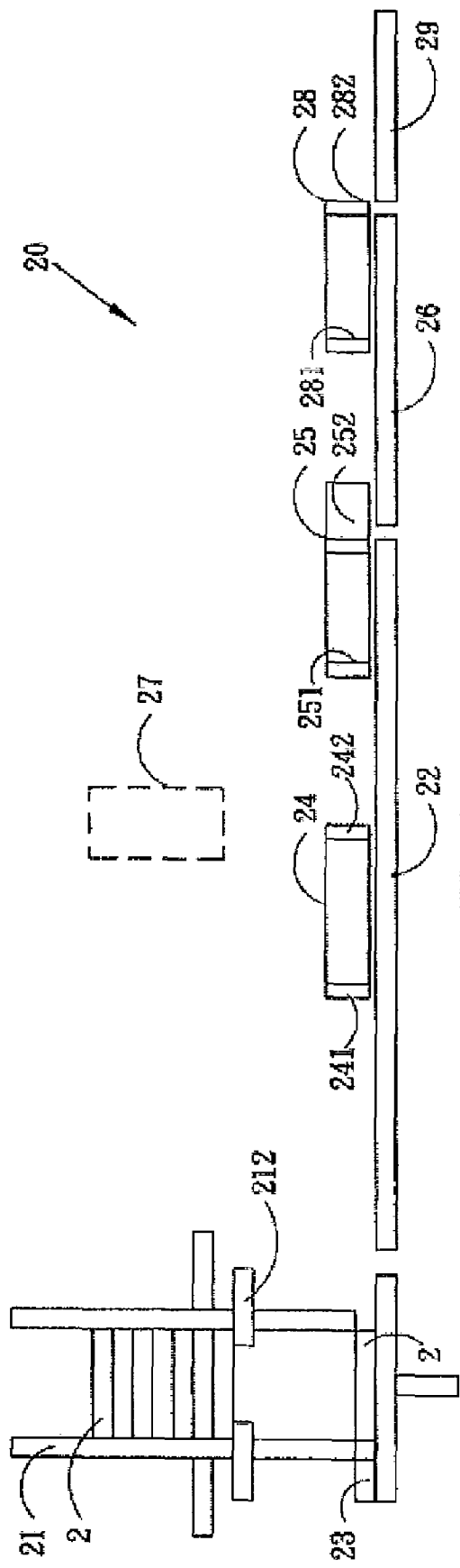
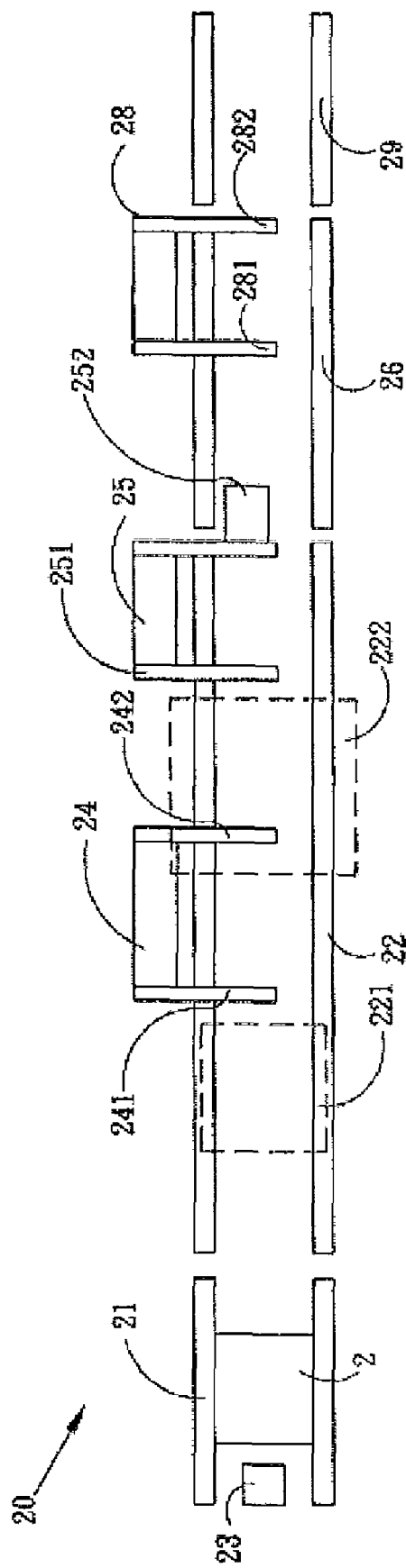
FIG. 2A
FIG. 2B

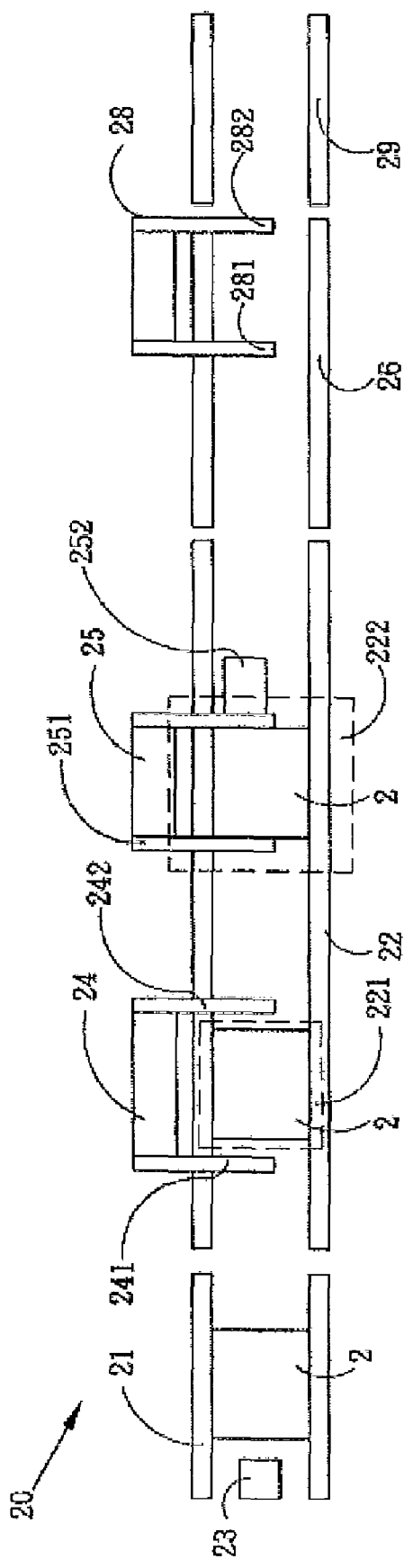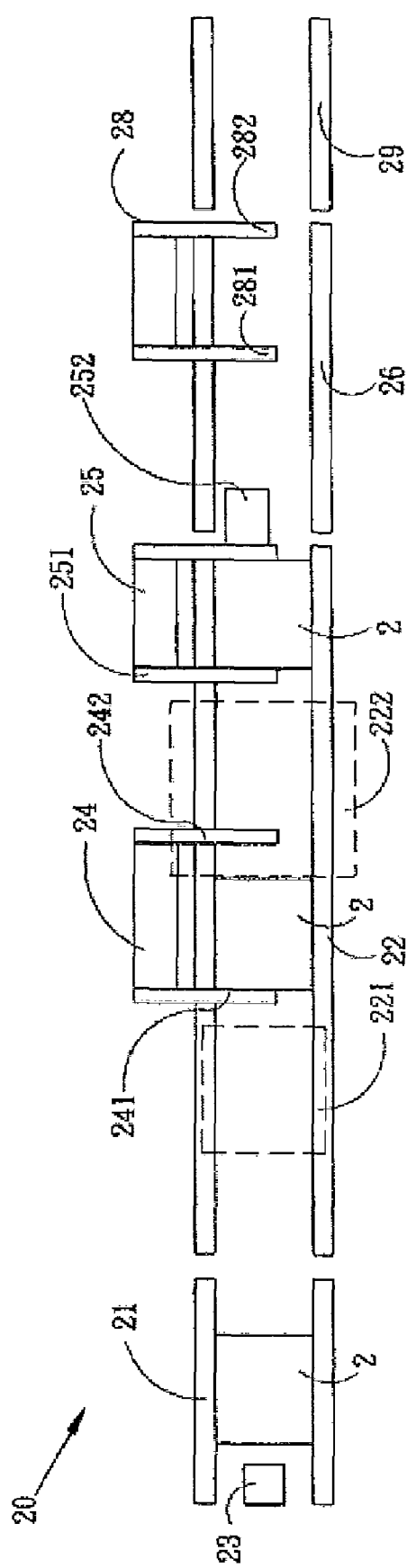
FIG. 2C
FIG. 2D

TRAY TRANSPORTATION DEVICE

BACKGROUND OF THE INVENTION

1. Field of the Invention

The present invention generally relates to a tray transportation device, and more particularly to a tray transportation device with two sets of operation handlers which moves together in order to increase the efficiency of transferring trays.

2. Description of the Prior Art

In the semiconductor device production process, the wafer test process is performed before the wafer dicing process by the automatic test equipment (ATE) to ensure the quality of electrical characteristics of the semiconductor device. After the wafers are divided into dies, a die sorter is used to pick up and place the dies on trays. The tray transportation device of the die sorter has great effects on the efficiency of the die sorter.

FIG. 1A and FIG. 1B show a schematic side view and a schematic top view of a conventional tray transportation device, respectively. The conventional tray transportation device 10 includes a tray storage tank 11, a transfer stage 12, a pushing lever 13, an operation handler 14, an unload stage 16, a unload handler 18, and a tray storage device 19. The tray transportation device 10 also includes a die pick-and-place head 17.

The tray storage tank 11 is used to store a plurality of trays 2, and the tray storage tank 11 has a tray exporting device 112 so as to export one tray 2 at one time. The pushing lever 13 is disposed under the tray storage tank 11 so as to push the tray 2 exported from the tray storage tank 11 to the transfer stage 12.

The transfer stage 12 is used to carry the tray 2 exported from the tray storage tank 11, and the transfer stage has a buffer area 121 and an operation area 122. The operation handler 14 is disposed on the transfer stage 12 so as to push the tray 2 on the transfer stage 12 and make the tray 2 move on the transfer stage 22. The die pick-and-place head 17 is disposed on the operation area 122 so as to pick a plurality of dies of a wafer and place the dies on the tray 2.

The unload stage 16 is used to carry the tray 2 transferred from the transfer stage 12. The unload handler 18 is disposed on the unload stage 16 so as to handle the tray 2 on the unload stage 16. The tray storage device 19 is used to store a plurality of the tray 2.

FIGS. 1C-1H show the operation process of the tray transportation device shown in FIG. 1B.

FIG. 1C shows the pushing lever pushes the tray 2 exported from the tray storage tank 11 to the buffer area 121 of the transfer stage 12.

FIG. 1D shows the operation handler 14 moves to the buffer area 121 and pushes the tray 2 on the transfer stage 12. At the same time, the tray storage tank 11 exports one tray 2 to the position in front of the pushing lever 13.

FIG. 1E shows the operation handler 14 pushes the tray 2 to the operation area 122. The die pick-and-place head 17 (not shown) is able to pick a plurality of dies of a wafer and place the dies on the tray 2. At the same time, the pushing lever 13 pushes the tray 2 exported from the tray storage tank 11 to the buffer area 121 of the transfer stage 12.

FIG. 1F shows the operation handler 14 pushes the tray 2 which has been filled with dies to the border between the transfer stage 12 and the unload stage 16.

FIG. 1G shows the operation handler 14 moves to the side position against the tray 2 and pushes the tray 2 towards the unload stage 16. At the same time, the tray storage tank 11 exports one tray 2 to the position in front of the pushing lever 13.

FIG. 1H shows the operation handler 14 pushes the tray 2 to the unload stage 16, then the unload handler 18 pushes the tray to the tray storage device 19. The operation handler 14 repeats the operation process mentioned above, the operation handler 14 moves to the buffer area 121 and pushes the next tray 2 on the transfer stage 12.

The conventional tray transportation device 10 mentioned above has only one operation handler 14, and achieves the purpose of moving the tray 2 on the transfer stage 12 by the operation handler 14. However, as the operation handler 14 has push the tray 2 to the unload stage 16, it takes long time for the operation handler 14 to move from the position of the unload stage 16 to the position of the buffer area 121 so as to push next tray 2. The die sorter has to wait for the operation handler 14 until the operation handler 14 finishes the movement. It is time-waste and decreases the efficiency of the die sorter.

For the reason that there are some disadvantages of the conventional tray transportation device mentioned above, a need has arisen to propose a novel conventional tray transportation device to solve the problem that the die sorter has to wait for the movement of operation handler and increase the efficiency of the die sorter. The novel tray transportation device is also capable of improving the efficiency of equipment which is similar to the conventional tray transportation device.

SUMMARY OF THE INVENTION

Accordingly, the present invention has been made in order to meet such a need described above, and it is an object of the present invention to provide a tray transportation device to solve the problem that the die sorter has to wait for the movement of operation handler so as to increase the efficiency of the die sorter.

In order to achieve the above object, the present invention provides a tray transportation device. The tray transportation device includes a transfer stage, a loading handler, an operation handler and an unload stage. The transfer stage has a buffer area and an operation area. The loading handler is disposed on the buffer area to handle a tray in the buffer area. The operation handler is disposed on the operation area to handle a tray in the operation area. The unload stage is used to carry the tray transferred from the transfer stage. The loading handler and the operation handler move together, when the operation handler transfers the tray from the operation area to the unload stage; the loading handler transfers the tray from the buffer area to the operation area.

BRIEF DESCRIPTION OF THE DRAWINGS

FIG. 1A and FIG. 1B show a schematic side view and a schematic top view of a conventional tray transportation device, respectively;

FIGS. 1C-1H show the operation process of the tray transportation device shown in FIG. 1B;

FIG. 2A and FIG. 2B show a schematic side view and a schematic top view of a tray transportation device in accordance with the first preferred embodiment of the present invention;

FIGS. 2C-2F show the operation process of the tray transportation device shown in FIG. 2B;

DETAILED DESCRIPTION OF THE INVENTION

Figure 1E:
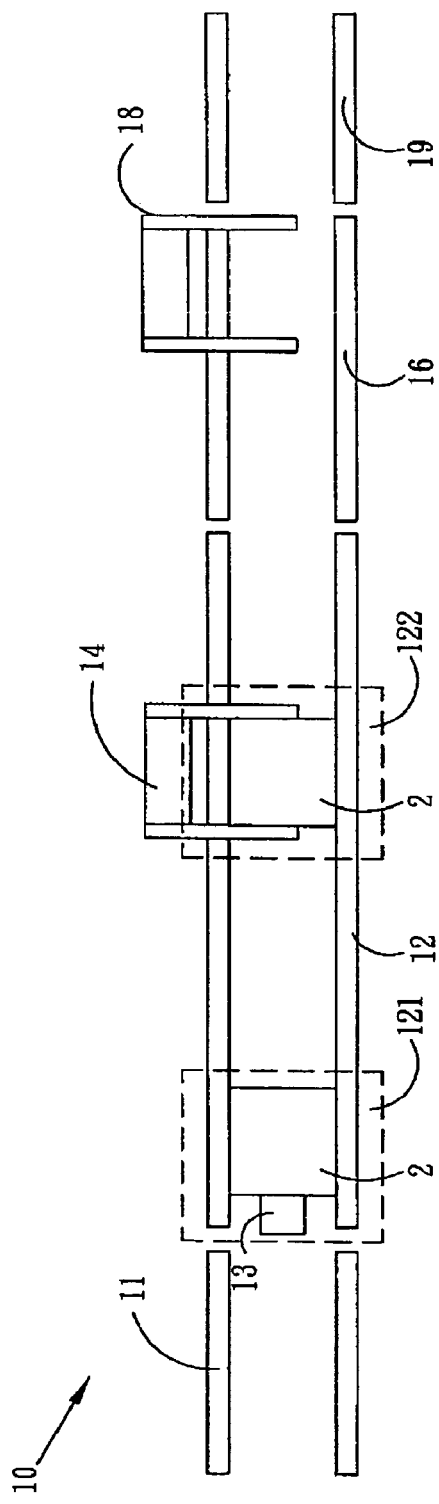
Figure 1F:
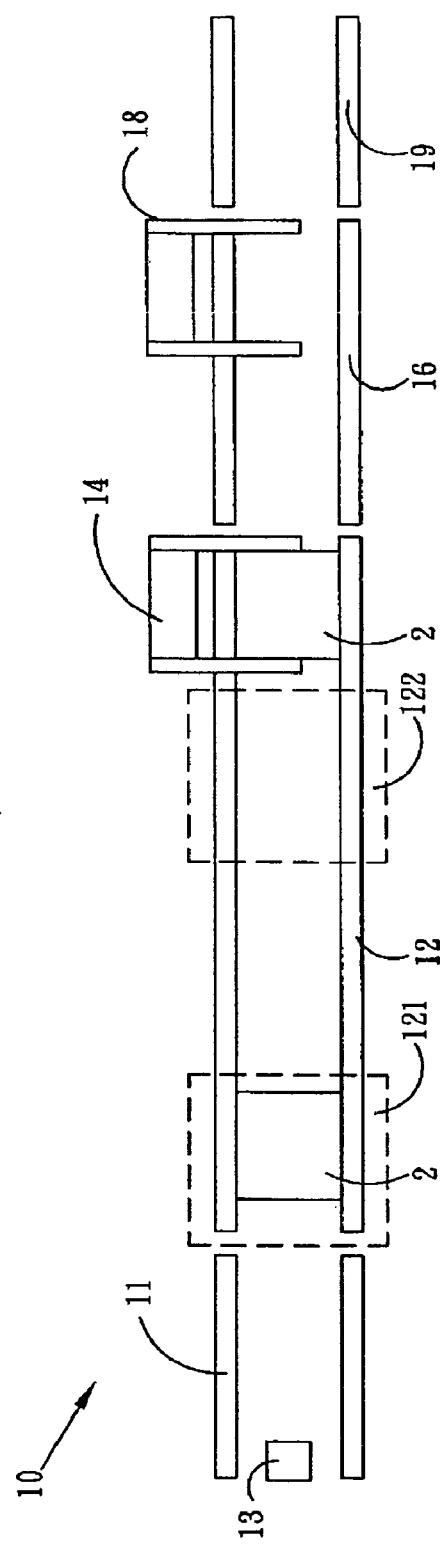

The detailed description of the present invention will be discussed in the following embodiments, which are not intended to limit the scope of the present invention, but can be adapted for other applications. While drawings are illustrated in details, it is appreciated that the quantity of the disclosed components may be greater or less than that disclosed, except expressly restricting the amount of the components.

FIG. 2A and FIG. 2B show a schematic side view and a schematic top view of a tray transportation device in accordance with the first preferred embodiment of the present invention. The tray transportation device 20 includes a tray storage tank 21, a transfer stage 22, a pushing lever 23, a loading handler 24, an operation handler 25, a unload handler 28, an unload stage 26, and a tray storage device 29. The tray transportation device 20 also includes an operation device 27.

The tray storage tank 21 is used to store a plurality of trays 2, and the tray storage tank 21 has a tray exporting device 212 so as to export one tray 2 at one time. The pushing lever 23 is disposed under the tray storage tank 21 so as to push the tray 2 exported from the tray storage tank 21 to the transfer stage 22.

The transfer stage 22 is used to carry the tray 2 exported from the tray storage tank 21, and the transfer stage has a buffer area 221 and an operation area 222. The operation device 27 is disposed on the operation area 222 to operate the tray 2 in the operation area 222. The operation device 27 can be a die pick-and-place head so as to pick a plurality of dies of a wafer and place the dies on the tray 2, otherwise the operation device 27 can be a die detect head so as to detect dies on the tray 2.

The loading handler 24 is disposed on the transfer stage 22, the loading handler 24 includes a first loading pushing end 241 and a second loading pushing end 242 so as to push the tray 2 in the buffer area 221 of the transfer stage 22. The operation handler 25 is disposed on the transfer stage 22, the operation handler 25 includes a first operation pushing end 251 and a second operation pushing end 252 so as to push the tray 2 in the operation area 222 of the transfer stage 22. Wherein the loading handler 24 and the operation handler 25 move together, when the operation handler 25 transfers the tray 2 from the operation area 222 to the unload stage 26, the loading handler 24 transfers the tray 2 from the buffer area 221 to the operation area 222.

The unload stage 26 is used to carry the tray 2 transferred from the transfer stage 22. The unload handler 28 includes a first unload pushing end 281 and a second unload pushing end 282, the unload handler 28 is disposed on the unload stage 26 so as to handle the tray 2 in the unload stage 26. The tray storage device 29 is used to store a plurality of the tray 2.

Figure 2E:
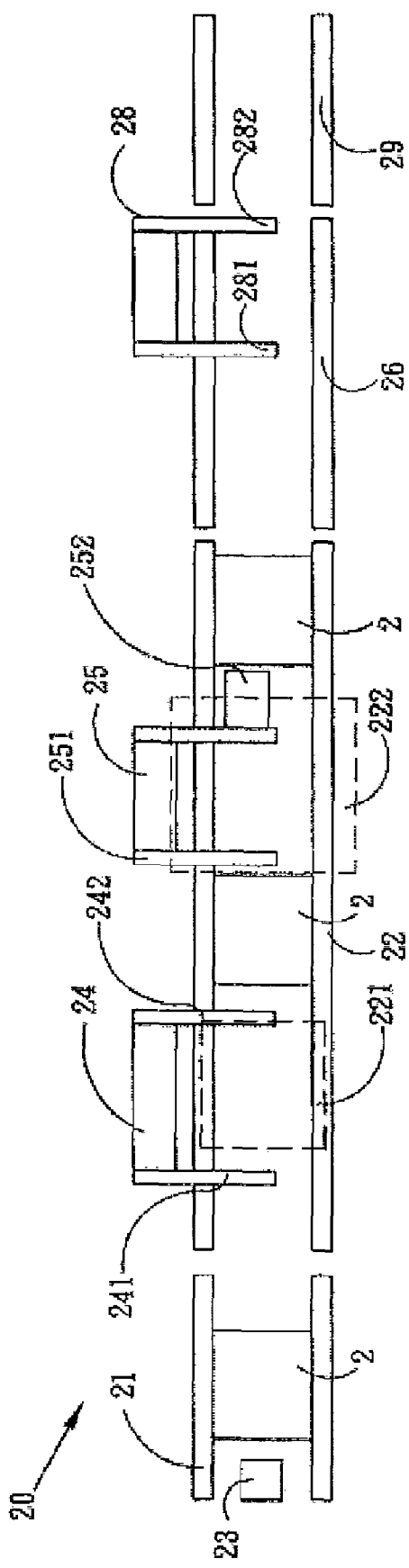

FIGS. 2C-2F show the operation process of the tray transportation device shown in FIG. 2B.

FIG. 2C shows the operation handler 25 pushes the tray 2 in the operation area, the operation device 27 (not shown) disposed on the operation area 222 is able to operate the tray 2 in the operation area 222. When the operation device 27 is a die pick-and-place head, the operation device 27 is able to pick a plurality of dies of a wafer and place the dies on the tray 2, or when the operation device 27 is a die detect head, the operation device 27 is able to detect dies on the tray 2. At the same time, the loading handler 24 pushes the tray 2 in the buffer area 221, and the tray storage tank 21 exports one tray 2 to the position in front of the pushing lever 23.

FIG. 2D shows the operation handler 25 pushes the tray 2 which has been operated to the border between the transfer stage 22 and the unload stage 26. At the same time, the loading handler 24 pushes the tray 2 towards the operation area 222.

FIG. 2E shows the operation handler 25 moves to the side position against the tray 2, the loading handler 24 also moves to the side position against the tray 2.

Figure 2F:
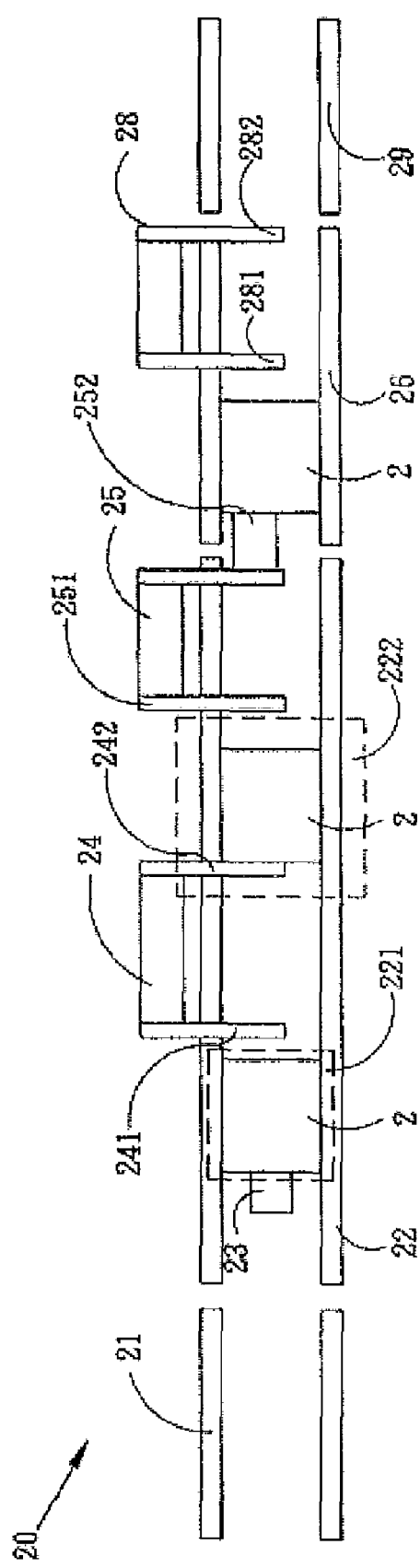

FIG. 2F shows the operation handler 25 pushes the tray 2 to the unload stage 26, then the unload handler 28 pushes the tray to the tray storage device 29. At the same time, the loading handler 24 pushes the tray 2 to the operation area 222, and the pushing lever 23 pushes the tray 2 exported from the tray storage tank 21 to the buffer area 221 of the transfer stage 22. Then the loading handler 24 and the operation handler 25 repeat the operation process mentioned above, the loading handler 24 moves to the buffer area 221 to push the tray 2 in the buffer area 221, and the operation handler 25 moves to the operation area 222 to push the tray 2 in the operation area 222.

Figure 3A:
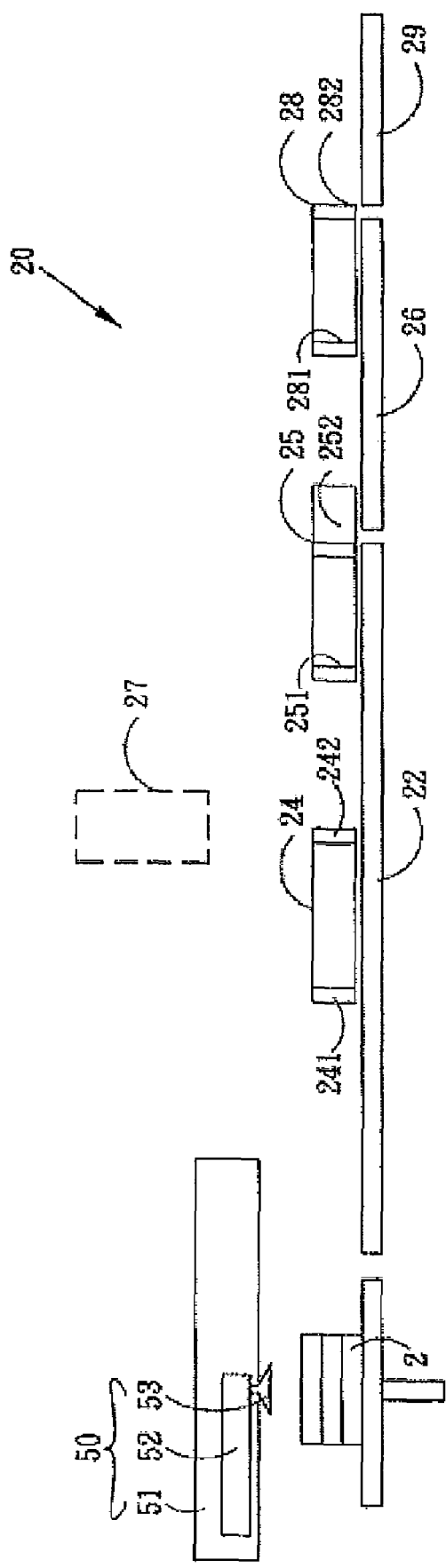
FIG. 3A and FIG. 3B show a schematic side view and a schematic top view of a tray transportation device in accordance with the second preferred embodiment of the present invention.
Figure 3B:
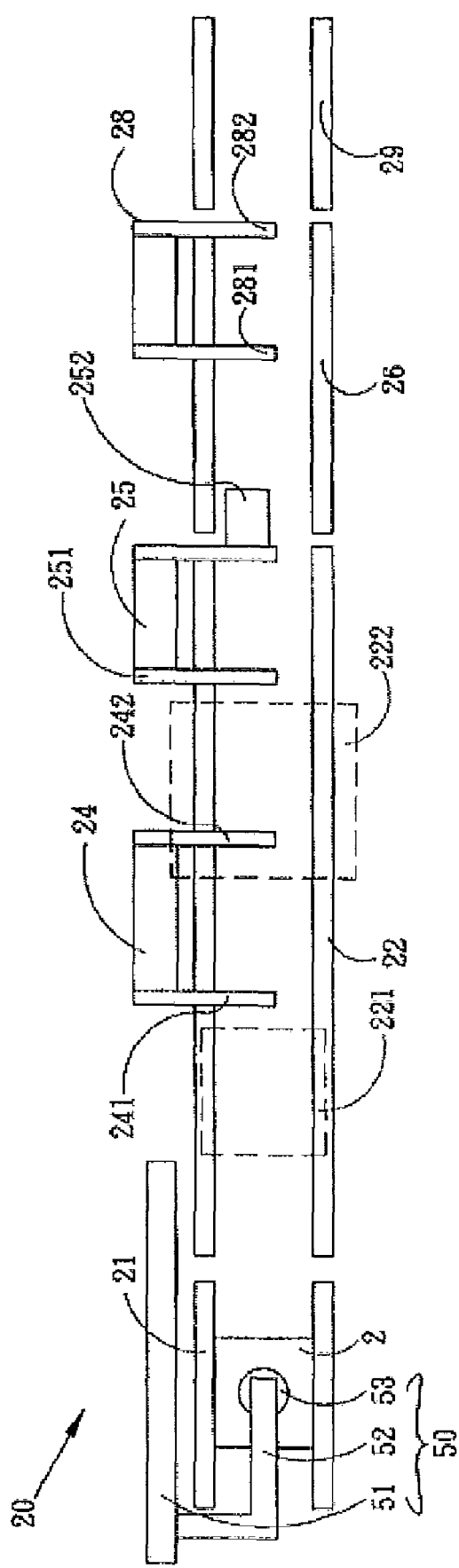

FIG. 3A and FIG. 3B show a schematic side view and a schematic top view of a tray transportation device in accordance with the second preferred embodiment of the present invention. The tray transportation device 20 further includes a loading device 50 so as to handle the tray 2 to the buffer area 221. The loading device 50 includes a driving apparatus 51, a supporting lever 52, and at least one pick head 53. The supporting lever 52 is disposed on the driving apparatus 51, the supporting lever 52 the pick head 53 so as to pick the tray 2 by the pick head 53 and transfer to the buffer area 221 by the driving apparatus 51. According to this embodiment, the appearance of the supporting lever 52 is L shape, but not limit to this, the L shape supporting lever 52 is used to avoid the collision between the supporting lever 52 and the structure of the transfer stage 22 during moving of the driving apparatus 51. The space of the transfer stage 22 can be used efficiently; therefore the L shape supporting lever 52 has great effect on the design of the tray transportation device 20.

By using the tray transportation device of the present invention, it is possible to unload a tray and move the tray in the buffer area to the operation area at the same time. Because the moving distance of the operation handler decreases, the time for the movement of the operation handler also decreases. The present invention does not only solve the problem that the die sorter has to wait for the movement of the operation handler, but also decreases the time for the movement of the operation handler. Therefore the efficiency of the die sorter increases.

Although specific embodiments have been illustrated and described, it will be appreciated by those skilled in the art that various modifications may be made without departing from the scope of the present invention, which is intended to be limited solely by the appended claims.

What is claimed is:

1. A tray transportation device comprising:
    a transfer stage, said transfer stage having a buffer area and an operation area;
    a loading handler, said loading handler disposed on the buffer area to handle a first tray in the buffer area, wherein said loading handler comprises a first loading pushing end and a second loading pushing end;
    an operation handler, said operation handler disposed on the operation area to handle a second tray in said operation area; and
    an unload stage, said unload stage used to carry said tray transferred from the transfer stage;

wherein said loading handler and said operation handler move together, when said operation handler pushes a sidewall of said second tray directly for transferring said second tray from said operation area to said unload stage, said loading handler pushes a sidewall of said first tray directly for transferring said first tray from said buffer area to said operation area, said first loading pushing end pushes said first tray first and then said second loading pushing end pushes said first tray so as to push said first tray in said buffer area to said operation area.

2. The tray transportation device according to claim 1, wherein said operation handler comprises a first operation pushing end and a second operation pushing end, said first operation pushing end pushes said second tray first and then said second operation pushing end pushes said second tray so as to push said second tray in said operation area to said unload stage.

3. The tray transportation device according to claim 1, further comprising an operation device disposed on said operation area to operate said second tray in said operation area.

4. The tray transportation device according to claim 3, wherein said operation device is a die pick-and-place head, said die pick-and-place head is used to pick a plurality of dies of a wafer and place said dies on said second tray.

5. The tray transportation device according to claim 3, wherein said operation device is a die detect head, said die detect head is used to detect dies on said second tray.

6. The tray transportation device according to claim 1, further comprising a unload handler disposed on said unload stage so as to handle said second tray in said unload stage.

7. The tray transportation device according to claim 6, wherein said unload handler comprises a first unload pushing end and a second unload pushing end, said first unload pushing end pushes said second tray first and then said second unload pushing end pushes said second tray so as to push said second tray in said unload stage to a tray storage device.

8. The tray transportation device according to claim 1, further comprising a loading device so as to handle said first to said buffer area.

9. The tray transportation device according to claim 8, wherein said loading device has a supporting lever so as to transfer said first tray.

10. The tray transportation device according to claim 9, wherein the appearance of said supporting lever is L shape.

11. A tray transportation device comprising:
a tray storage tank, said tray storage tank storing a plurality of trays, and said tray storage tank having a tray exporting device to export one said tray at one time;
a transfer stage, said transfer stage carrying said tray exported from said tray storage tank, and said transfer stage having a buffer area and an operation area;
a loading device, said loading device handling said tray to said buffer area;
a loading handler, said loading handler disposed on the buffer area to handle a first tray in the buffer area, wherein said loading handler comprises a first loading pushing end and a second loading pushing end;
an operation handler, said operation handler disposed on the operation area to handle a second tray in said operation area; and
an unload stage, said unload stage used to carry said tray transferred from the transfer stage;
wherein said loading handler and said operation handler move together, when said operation handler pushes a sidewall of said second tray directly for transferring said second tray from said operation area to said unload stage, said loading handler pushes a sidewall of said first tray directly for transferring said first tray from said buffer area to said operation area, said first loading pushing end pushes said first tray first and then said second loading pushing end pushes said first tray so as to push said first tray in said buffer area to said operation area.

12. The tray transportation device according to claim 11, wherein said operation handler comprises a first operation pushing end and a second operation pushing end, said first operation pushing end pushes said second tray first and then said second operation pushing end pushes said second tray so as to push said second tray in said operation area to said unload stage.

13. The tray transportation device according to claim 11, further comprising an operation device disposed on said operation area to operate said second tray in said operation area.

14. The tray transportation device according to claim 13, wherein said operation device is a die pick-and-place head, said die pick-and-place head is used to pick a plurality of dies of a wafer and place said dies on said second tray.

15. The tray transportation device according to claim 13, wherein said operation device is a die detect head, said die detect head is used to detect dies on said second tray.

16. The tray transportation device according to claim 11, further comprising a unload handler disposed on said unload stage so as to handle said second tray in said unload stage.

17. The tray transportation device according to claim 16, wherein said unload handler comprises a first unload pushing end and a second unload pushing end, said first unload pushing end pushes said second tray first and then said second unload pushing end pushes said second tray so as to push said second tray in said unload stage to a tray storage device.

18. The tray transportation device according to claim 11, said loading device has a pushing lever, said pushing lever is disposed under said tray storage tank so as to push said tray exported from said tray storage tank to said buffer area of said transfer stage.

19. The tray transportation device according to claim 11, wherein said loading device has a supporting lever so as to transfer said tray.

20. The tray transportation device according to claim 19, wherein the appearance of said supporting lever is L shape.

* * * * *